US006322656B1

(12) United States Patent
Fakler et al.

(10) Patent No.: US 6,322,656 B1
(45) Date of Patent: Nov. 27, 2001

(54) METHOD AND COMPOSITION FOR AMINE BORANE REDUCTION OF COPPER OXIDE TO METALLIC COPPER

(75) Inventors: John Fakler, Phoenix; Michael Rush, Scottsdale; Scott Campbell, Fountain Hills, all of AZ (US)

(73) Assignee: Morton International, Inc., Chicago, IL (US)

( * ) Notice: Subject to any disclaimer, the term of this patent is extended or adjusted under 35 U.S.C. 154(b) by 964 days.

(21) Appl. No.: 08/574,954

(22) Filed: Dec. 19, 1995

(51) Int. Cl.$^7$ ..................................... B32B 31/00
(52) U.S. Cl. .................. 156/281; 148/269; 148/272; 252/188.1; 252/188.2
(58) Field of Search ............................ 156/281; 148/272, 148/269; 252/188.1, 188.2

(56) References Cited

U.S. PATENT DOCUMENTS

| 4,002,778 | * | 1/1977 | Bellis et al. | 427/98 |
| 4,343,660 | * | 8/1982 | Martin | 148/269 |
| 4,642,161 | * | 2/1987 | Akahoshi et al. | 156/314 |
| 5,147,492 | * | 9/1992 | Chen | 148/272 |

OTHER PUBLICATIONS

Akahoshi et al., *New Copper Surface Treatment for Polyinride Multilayer Printed Wiring Boards*, Circuit World 14(1) (1987).

Hitachi, Ltd., Technical Publication: *Chemical Reduction Treatment of Copper Oxide: DMAB Method* (undated).

\* cited by examiner

Primary Examiner—John J. Gallagher

(57) ABSTRACT

An improvement in a method of bonding copper and a resin together wherein a copper oxide layer is formed on the surface of copper by the oxidation of metallic copper, the copper oxide layer is reduced to metallic copper with an aqueous reducing solution containing at least one amine borane represented by the general formula: $BH_3NHRR'$ (wherein R and R' are each a member selected from the group consisting of H, $CH_3$, and $CH_2CH_3$), and the metallic copper is bonded to a resin. According to the improvement, a reducing stabilizer is added to the reducing solution in an amount sufficient to decrease consumption of the amine borane during reduction to a level less than that consumed in the absence of the reducing stabilizer during the course of the copper oxide reduction process, wherein the stabilized reduction process is initiated in a reasonable time and the metallic copper layer resulting from the stabilized reduction process is resistant to acid attack. Examples of such reducing stabilizers include thio-containing ($—C(=S)NH_2$) compounds, triazole-containing ($C_2H_3N_3$) compounds, isoxazole-containing ($—C_3HNO$) compounds, thiazole-containing ($—NCS—$) compounds, imidazole-containing ($—NCN—$) compounds, and sulfone-containing ($—SO_3H$) compounds.

19 Claims, No Drawings

METHOD AND COMPOSITION FOR AMINE BORANE REDUCTION OF COPPER OXIDE TO METALLIC COPPER

FIELD OF THE INVENTION

The present invention relates to an improvement in amine borane reduction of copper oxide to metallic copper.

BACKGROUND OF THE INVENTION

Successful fabrication of multilayer printed circuit boards requires bonding together of copper and resin layers. However, direct bonding of copper and resin layers does not provide sufficient bonding strength. Therefore, it is common to improve copper-resin bonding strength by depositing on the copper surface an oxide layer, such as cuprous oxide, cupric oxide, or the like. Formation of the oxide layer, which turns the pink copper surface a black-brown color, creates minute unevennesses on the copper surface which provide an interlocking effect between the copper surface and resin, thus improving bonding strength.

However, copper oxides are readily hydrolyzed and dissolved upon contact with acid. Because various acid treatments are used in later stages of fabrication of multilayer circuit boards, oxide layer deposition has been problematic at best. Acid attack on the oxide layer is commonly referred to in the industry as "pink ring", because as acid strips the black-brown oxide layer from the surface, a ring of bare pink copper becomes evident.

The problem of vulnerability of the oxide layer to acid was solved by the method described in U.S. Pat. No. 4,642,161 to Akahoshi et al., herein incorporated by reference in its entirety; the Akahoshi et al. patent has been assigned to Hitachi, Ltd. The Akahoshi et al. method is also described in Akahoshi et al., *Circuit World* 14(1) (1987), and in the Hitachi, Ltd. technical publication "The Chemical Reduction Treatment of Copper Oxide, DMAB Method (Technology for the Elimination of Pink Ring", both of which references are herein incorporated by reference in their entireties.

In the Akahoshi et al. method, the copper oxide layer is reduced to metallic copper by means of a reducing solution containing an amine borane compound as the active reducing agent. The minute unevennesses created on the copper surface from oxidation remain following reduction, so that the metallic copper surface produced as a result of the reduction process will form a sufficiently strong bond with a resin. In contrast to cupric oxide and cuprous oxide, which are both soluble in acid, the metallic copper surface resulting from the reduction process, which is the same black-brown color as the oxide layer, has good acid resistance. Therefore by reducing the copper oxide to metallic copper, the acid resistance of the surface or panel is increased, and there is a reduced likelihood of the appearance of "pink ring".

The presently known reducing agents which are capable of reducing cupric oxide to metallic copper are amine boranes represented by the general formula: $BH_3NHRR'$ (wherein R and R' are each a member selected from the group consisting of H, $CH_3$, and $CH_2CH_3$), such as dimethylamine borane (DMAB) and ammonia borane. These reducing agents are quite expensive.

During the reduction process the reducing agents are consumed by the copper oxide on the panels. The stoichiometric consumption of reducing agent can be determined from the half reaction:

$$BH_3 + 3H_2O \rightarrow H_3BO_3 + 6H^+ + 6e^-$$

It is known that the reducing agent continues to be consumed even after all of the cupric oxide on the panels has been reduced to copper metal, and no additional cupric oxide is introduced into the solution. Consumption of reducing agent continues after reduction of the copper oxide panels because, it is theorized, that the reduced copper oxide from the panels is still present in the reducing solution, and may be reoxidized or may catalyze the hydrolysis of the DMAB. Therefore, the reducing agents are consumed in greater than the stoichiometric amount necessary to reduce the copper oxide on the panels. The excessive consumption of the reducing agent shortens the usable lifetime of the reducing solution, and ultimately results in higher operating costs for the process.

Thus, it is clearly desirable to develop a method and composition to stabilize the reduction process so as to reduce consumption of the costly reducing agent, while ensuring that the metallic copper layer resulting from such a stabilized reduction process has good bonding properties and acid resistance.

SUMMARY OF THE INVENTION

The present invention is summarized as an improvement in a method of bonding copper and a resin together wherein a copper oxide layer is formed on the surface of copper by oxidation of copper, the copper oxide layer is reduced to metallic copper with an aqueous reducing solution containing at least one amine borane represented by the general formula: $BH_3NHRR'$ (wherein R and R' are each a member selected from the group consisting of H, $CH_3$, and $CH_2CH_3$), and the metallic copper is bonded to a resin. According to the improvement, a reducing stabilizer is added to the reducing solution in an amount sufficient to decrease consumption of the amine borane during reduction to a level less than that consumed in the absence of the stabilizer during the course of the copper oxide reduction process, wherein the stabilized reduction process is initiated in a reasonable time and the metallic copper layer resulting from the stabilized reduction process is resistant to acid attack. Examples of such reducing stabilizers include thio-containing (—C(=S)NH$_2$) compounds, triazole-containing ($C_2H_3N_3$) compounds, isoxazole-containing (—C$_3$HNO) compounds, thiazole-containing (—NCS—) compounds, imidazole-containing (—NCN—) compounds, and sulfone-containing (—SO$_3$H) compounds.

It is an object of the present invention to decrease consumption of the amine borane compounds used to reduce copper oxide to metallic copper while producing a metallic copper layer having a resistance to acid attack of greater than 30 minutes.

It is another object of the present invention to increase the life of a reducing solution used in a reduction process.

It is another object of the present invention to decrease operating costs for copper oxide reduction processes.

Other objects, advantages, and features of the present invention will become apparent from the following specifications.

DETAILED DESCRIPTION OF THE INVENTION

The present specification describes an improved method and composition for amine borane reduction of copper oxide to metallic copper.

As previously described, copper oxide reduction is particularly useful in the manufacturing of multi-layer printed circuit boards because formation of the oxide layer, which turns the pink copper surface a black-brown color, creates minute unevennesses on the copper surface which provide an interlocking effect between the copper surface and resin, thus improving bonding strength of the layers. However, because copper oxides are soluble in acid, the oxide layer is vulnerable to acid attack.

The Akahoshi et al. method solved the problem of the acid vulnerability of the oxide layer. According to that method, the copper oxide layer is reduced to metallic copper by means of a reducing solution containing an amine borane compound as the active reducing agent. The minute unevennesses created on the copper surface from oxidation remain following reduction, so that the metallic copper surface produced as a result of the reduction process will form a sufficiently strong bond with a resin, and the metallic copper surface resulting from the reduction process, which is the same black-brown color as the oxide layer, has good acid resistance. Because good acid resistance indicates that the copper oxide layer has been successfully reduced to metallic copper (despite no change in color of the surface), and because such a metallic copper surface retains the minute unevennesses created by the earlier oxidation process, good acid resistance also indicates that the metallic copper surface resulting from the reduction process will have an excellent ability to bond with resins such as those described in the Akahoshi et al. patent. Such resins include epoxy resins, polyamide resins, polyimide resins, polyester resins, phenolic resins, and thermoplastic resins such as polyethylene, polyphenylene sulfide, polyether-imide resins, and fluororesins.

However, the amine boranes (which include dimethylamine borane, also known as "DMAB", and ammonia borane) used in the Akahoshi et al. are expensive. Furthermore, after completion of the desired reduction of copper oxide surfaces, the amine boranes are consumed in the reduction solution in amounts greatly in excess of the amount stoichiometrically required for reduction of copper oxide surfaces or panels. Thus, reduction of copper oxide typically has high operating costs.

The present inventor discovered that addition of stabilizers to amine borane reducing solutions decreased amine borane consumption to between about 11% to 92% of amine borane consumption observed in the absence of such stabilizers. As described in the Akahoshi, et al. patent, the typical aqueous reducing solution contains at least one amine borane represented by the general formula: $BH_3NHRR'$ (wherein R and R' are each a member selected from the group consisting of H, $CH_3$, and $CH_2CH_3$); such amine boranes include dimethylamine borane (DMAB) and ammonia borane, in a composition range of about 0.1 g/L to saturation, preferably, about 0.1–10.0 g/L.

Suitable reduction stabilizers include thio-containing ($-C(=S)NH_2$) compounds such as thiourea, triazole-containing ($C_2H_3N_3$) compounds such as tolytriazole and benzotriazole, isoxazole-containing ($-C_3HNO$) compounds such as 3-amino-5-methylisoxazole, thiazole-containing ($-NCS-$) compounds such as mercaptobenzothiazole, imidazole-containing ($-NCN-$) compounds such as benzimidazole, and sulfone-containing ($-SO_3H$) compounds such as sulfamic acid.

The selection of a particular stabilizer and stabilizer concentration is based on several factors, including the following: whether the reduction process stabilized by a given concentration of selected stabilizer is initiated within a reasonable time (preferably in less than about 5 minutes), whether the metallic copper layer resulting from the thus stabilized reduction process is resistant to acid attack (one suggested measure of such resistance is whether the metallic copper layer can withstand acid attack for at least about 30 minutes), and finally, whether the given concentration of selected stabilizer actually results in a decreased consumption of the amine borane reducing agent.

The above criteria were used to identify the following preferred stabilizers and stabilizer concentrations in a reducing solution consisting of about 1.6 g/L dimethylamine borane and 15.2 g/L sodium hydroxide at about 80° F.: thiourea (about 1 ppm–13 ppm); tolytriazole (about 0.50 ppm); benzotriazole (about 1.0 ppm); 3-amino-5-methylisoxazole (about 100 ppm); mercaptobenzothiazole (about 10 ppm); benzimidazole (about 10 ppm); and sulfamic acid (about 10 g/L).

The present inventor also discovered that the effective concentration ranges of the preferred stabilizers are dependent both on the temperature of the reducing solution, and also on the concentration of reducing agent. For example, in a reducing solution consisting of about 1.6 g/L DMAB and 15.2 g/L sodium hydroxide, raising the temperature from about 80° F. to about 120° F. increases the upper limit of the effective concentration range of thiourea stabilizer from about 13 ppm to about 20 ppm. Increasing the DMAB concentration to 10 g/L, at 80° F., increases the upper limit of the effective range of thiourea stabilizer to about 160 ppm; at a concentration of 10 g/L DMAB, if the temperature is increased to about 120° F., the upper limit of the effective range of thiourea stabilizer increases to about 200 ppm.

The preferred stabilizers and concentrations are given for illustration purposes only; other concentrations of the preferred stabilizers, and other stabilizers and concentrations within the given chemical families listed above, can be easily identified according to the above-listed factors, by following the procedures outlined in the Examples provided below.

General Procedures

In order to test the potential stabilizers, the present inventor created reducing solutions similar to those used in an actual copper oxide reduction process. The reducing solutions were then poisoned with copper oxide, because during an actual copper oxide reduction process, copper oxide remains in the reducing solution after the reduced copper panels are removed. The remaining copper oxide consumes further amounts of the reducing agent, resulting in overall consumption of reducing agent in greater than the stoichiometric amount necessary for reduction of copper oxide on the panels. Thus, the consumption of reducing agent per gram of copper oxide and the consumption of reducing agent per time could be determined. The concentration of the reducing agent was analytically determined initially and after 24 hours, via iodometric titration.

The possible negative effects a given potential stabilizer could have on the copper oxide reduction process were determined by processing a copper oxide panel through the reducing solution containing a given potential stabilizer. As described above, there were several parameters examined to determine the effectiveness of such stabilized reducing processes; reduction process initiation time, acid resistance of the metallized copper surfaces resulting from the stabilized reduction, and weight loss of the copper oxide coating after reduction.

Initiation time is the time required for copper oxide reduction to begin. When the reduction reaction begins, hydrogen bubbles rapidly form and continue until the reaction is complete. Acid resistance was determined by immersing the resulting metallized copper surface in an acid bath. Metallic copper survives longer than copper oxides in an acid bath. Thus, the effectiveness of a given stabilized reduction process in producing the desired metallic copper surface, was determined by resistance to acid attack.

Weight loss of the tested panel also determines the effectiveness of the reduction process. Copper oxide loses weight when it is chemically reduced to copper metal. By measuring the weight loss of the panels, the completeness of reduction was determined. A low weight loss indicates that the copper oxide is not fully being reduced. Copper oxide panels were made by growing an oxide layer on a metallic copper panel.

EXAMPLE 1

To illustrate the effect of poisoning the bath with copper oxide, consumption of reducing agent in a reducing solution poisoned with copper oxide was compared to consumption of reducing agent in an unpoisoned reducing solution. An aqueous reducing solution was prepared using 1.6 grams per liter dimethylamine borane (DMAB) and 15.2 g/L sodium hydroxide. DMAB was obtained from Aldrich Chemical Company, Milwaukee, Wis. Sodium hydroxide was purchased from Hill Brothers Chemical Company, Orange, Calif. That solution, at room temperature (80° F.), was used as the control solution. One liter of the control solution was poisoned with 0.075 g/L of copper oxide. Consumption of reducing agent was determined after 4 minutes and after 24 hours in both the control, and the poisoned, samples. The results are provided in Table 1. Table 1 also compares the stoichiometric consumption of dimethylamine borane to the actual consumption of dimethylamine borane.

TABLE 1

| DMAB Solution | Initial Concentration of DMAB | Stoichiometric Consumption of DMAB to Reduce All Copper Oxide | Consumption of DMAB Over 4 Minutes | Consumption of DMAB Over 24 Hours |
|---|---|---|---|---|
| control | 1.6 g/L | N.A. | <0.001 g/L | 0.009 g/L |
| control poisoned with 0.075 g/L CuO | 1.6 g/L | 0.0192 g/L | 0.046 g/L | 0.830 g/L |

EXAMPLE 2

Acid resistance of unreduced copper oxide panels was compared to the acid resistance of reduced copper oxide panels. A reduced copper oxide coated panel and an unreduced copper oxide coated panel were placed in a 10 % by volume hydrochloric acid bath. The results are listed in Table 2.

TABLE 2

| Copper Oxide Coated Panel | Acid Resistance |
|---|---|
| reduced copper oxide | 55 min |
| unreduced copper oxide | 0.5 min |

EXAMPLE 3

All potential stabilizers were tested initially to determine what effect a given stabilizer had on the reduction of a copper oxide coated copper panel. The initial concentration of each tested stabilizer was 1 g/L of stabilizer added to the control reducing solution described in Example 1. The effectiveness of a given potential stabilizer at reduction of a copper oxide coated copper panel was determined by percent weight loss, initiation time, and acid resistance. The acceptable criteria for the above parameters was a weight loss greater than 15%, an initiation time less than 4 minutes, and an acid resistance greater than 30 minutes. If the stabilizer adversely affected the reduction of the copper oxide coated copper panel, then the concentration of the stabilizer was decreased tenfold, and retested.

All reducing solution compositions were based on the control reducing solution of Example 1, which was an aqueous reducing solution of 1.6 grams per liter dimethylamine borane (DMAB) and 15.2 g/L sodium hydroxide. The stabilizers were added to the control solution in the concentrations listed in Tables 3–9, below.

Thiourea and sulfamic acid were obtained from Van Waters & Rogers Inc., Seattle, Wash. Tolytriazole and benzotriazole were obtained from the PMC Corporation, Cincinnati, Ohio. Mercaptobenzothiazole, benzimidazole, and 3-amino-5-methylisoxazole were obtained from Aldrich Chemical Company, Milwaukee, Wis.

TABLE 3

THIOUREA as a Stabilizer

| Thiourea Concentration | % Weight Loss | Initiation Time | Acid Resistance | Consumption of Dimethylamine Borane Over 24 Hours |
|---|---|---|---|---|
| 1.0 g/L | 7.55% | >4 min | <10 sec | |
| 0.5 g/L | 2.2% | >4 min | <10 sec | |
| 0.25 g/L | 3.0% | >4 min | <10 sec | |
| 25 ppm | 9.8% | 3.5 min | <10 sec | |
| 2.5 ppm | 27% | 60 sec | 40 min | |
| 0 (control) | 26.5 | 40 sec | 55 min | 0.830 g/L |
| 1 ppm | 25.1 | 50 sec | 50 min | 0.230 g/L |
| 2.5 ppm | 27.0 | 60 sec | 40 min | 0.096 g/L |
| 5 ppm | 24.0 | 60 sec | 40 min | 0.062 g/L |
| 8 ppm | 23.7 | 60 sec | 40 min | 0.068 g/L |
| 10 ppm | 23.1 | 60 sec | 40 min | 0.072 g/L |
| 13 ppm | 21.6 | 60 sec | 40 min | 0.059 g/L |
| 15 ppm | 21.0 | 90 sec | 3 min | 0.052 g/L |

TABLE 4

TOLYTRIAZOLE as a Stabilizer

| Tolytriazole Concentration | % Weight Loss | Initiation Time | Acid Resistance |
|---|---|---|---|
| 0.5 g/L | 5.9% | >4 min | <10 sec |
| 0.05 g/L | 10.7% | >4 min | <10 sec |
| 0.005 g/L | 13.7% | >4 min | <10 sec |
| 0.0005 g/L | 24.9% | 25 sec | 45 min |

TABLE 5

BENZOTRIAZOLE as a Stabilizer

| Benzotriazole Concentration | % Weight Loss | Initiation Time | Acid Resistance |
|---|---|---|---|
| 1.0 g/L | 6.1% | >4 min | <10 sec |
| 0.10 g/L | 11.3% | >4 min | <10 sec |
| 0.01 g/L | 13.5% | 3 min | 4 min |
| 0.001 g/L | 25.3% | 35 sec | 45 min |

TABLE 6

ISOXAZOLE as a Stabilizer

| Isoxazole Concentration | % Weight Loss | Initiation Time | Acid Resistance |
|---|---|---|---|
| 1.0 g/L | 12.5% | 110 sec | 10 sec |
| 0.5 g/L | 17.1% | 120 sec | 3 min |
| 0.1 g/L | 26.2% | 60 sec | 50 min |

TABLE 7

MERCAPTOBENZOTHIAZOLE as a Stabilizer

| Mercapto-benzothiazole Concentration | % Weight Loss | Initiation Time | Acid Resistance |
|---|---|---|---|
| 1.0 g/L | 0% | >4 min | <10 sec |
| 0.1 g/L | 13.7% | 120 sec | <10 sec |
| 0.01 g/L | 25.0% | 60 sec | 45 min |

TABLE 8

BENZIMIDAZOLE as a Stabilizer

| Benzimidazole Concentration | % Weight Loss | Initiation Time | Acid Resistance |
|---|---|---|---|
| 1.0 g/L | 0% | >4 min | <10 sec |
| 0.1 g/L | 2.0% | >4 min | <10 sec |
| 0.01 g/L | 17.2% | 60 sec | 44 min |

TABLE 9

SULFAMIC ACID as a Stabilizer

| Sulfamic Acid Concentration | % Weight Loss | Initiation Time | Acid Resistance |
|---|---|---|---|
| 1.0 g/L | 21.6% | 40 sec | 40 min |
| 10.0 g/L | 21.6% | 40 sec | 40 min |

EXAMPLE 4

For each potential stabilizer identified in Example 3, the concentration at which an acceptable reduction of a copper oxide coated copper panel was achieved was next tested to determine the effect the potential stabilizer had on consumption of dimethylamine borane over 24 hours.

As in Example 3, an aqueous reducing solution was prepared using 1.6 grams per liter dimethylamine borane and 15.2 g/L sodium hydroxide. The solution, at room temperature, was used as a control to reduce copper oxide formed on the above mentioned copper panels by immersing the panels in the reducing solution for a 4 minute dwell time. The initiation time was recorded. The percent weight loss of the copper oxide coating and the time that the coupon survived a 10% by volume hydrochloric acid bath were recorded. An acceptable acid resistance time is 30 minutes or greater. The reducing solution was then poisoned with 0.075 grams per liter of copper oxide. The consumption of reducing agent was determined analytically, via titration, initially and after 24 hours, with no further copper oxide introduced.

The control was modified by adding the compounds listed in Table 10 at the given respective concentrations. The parameters of initiation time, percent weight loss of the copper oxide coating, acid resistance of the resultant coating, and consumption over 24 hours were determined and compared to the control. The results are listed in Table 10.

TABLE 10

| Stabilizer | Concentration of Stabilizer | Initiation Time | % Weight Loss | Acid Resistance | Consumption of Dimethylamine Borane Over 24 Hours |
|---|---|---|---|---|---|
| Control | 0 | 30 sec | 30% | 55 min | 0.830 g/L |
| Thiourea | 2.5 ppm | 60 sec | 27% | 40 min | 0.096 g/L |
| Tolytriazole | 0.50 ppm | 25 sec | 25% | 45 min | 0.624 g/L |
| Benzotriazole | 1 ppm | 35 sec | 25% | 45 min | 0.656 g/L |
| 3-Amino-5-methylisoxazole | 100 ppm | 60 sec | 26% | 50 min | 0.576 g/L |
| mercaptobenzothiazole | 10 ppm | 60 sec | 25% | 45 min | 0.320 g/L |
| benzimidazole | 10 ppm | 60 sec | 17% | 44 min | 0.432 g/L |
| sulfamic acid | 10 g/L | 40 sec | 22% | 40 min | 0.768 g/L |

As Table 10 indicates, the listed stabilizers provide significant decreases in consumption of dimethylamine borane. When thiourea was used to stabilize the reduction process, DMAB consumption was only 11.6% of the DMAB consumption in the control reduction process; stabilization with thiourea achieved acceptable values of the parameters of initiation time, weight loss, and acid resistance.

Although stabilization with thiourea achieved the greatest reduction in consumption of DMAB, all the listed stabilizers achieved reduction in DMAB consumption while achieving acceptable values of the given parameters. To summarize, the effectiveness the listed stabilizers had in reducing DMAB consumption as compared to the control range as follows: thiourea (11.6%); mercaptobenzothiazole (38.6%); benzimidizole (52.0%); 3-amino-5-methylisoxizole (69.4%); tolytriazole (75.2%); benzotriazole (79.0%); and sulfamic acid (92.5%). Given the high cost of DMAB, even the modest reduction in consumption provided by using sulfamic acid as a stabilizer can achieve significant savings in operating costs.

EXAMPLE 5

The effective concentration range of stabilizer in the reducing solution is dependent on the concentration of reducing agent. To illustrate the concentrations of thiourea which may be used as a stabilizer for a dimethylamine borane reducing solutions, reducing solutions of various dimethylamine borane concentrations were made and the ability to reduce copper oxide panels with various concentrations of thiourea were tested.

An aqueous solution of 1.6 grams per liter dimethylamine borane and 15.2 g/L sodium hydroxide was made. Thiourea was added to this solution in different concentrations and the solution's ability to reduce copper oxide panels was determined. Thiourea was added to the reducing solution in the concentrations listed in Table 11 below.

TABLE 11

| Dimethylamine Borane Concentration | Thiourea Concentration | % Weight Loss | Initiation Time | Acid Resistance |
| --- | --- | --- | --- | --- |
| 1.6 g/L | 0 ppm | 26.5 | 40 sec | 55 min |
| 1.6 g/L | 1 ppm | 25.1 | 50 sec | 50 min |
| 1.6 g/L | 2.5 ppm | 27.0 | 60 sec | 40 min |
| 1.6 g/L | 5 ppm | 24.0 | 60 sec | 40 min |
| 1.6 g/L | 8 ppm | 23.7 | 60 sec | 40 min |
| 1.6 g/L | 10 ppm | 23.1 | 60 sec | 40 min |
| 1.6 g/L | 13 ppm | 21.6 | 60 sec | 40 min |
| 1.6 g/L | 15 ppm | 21.0 | 90 sec | 3 min |

An aqueous solution of 5.0 grams per liter dimethylamine borane and 15.2 g/L sodium hydroxide was made. Thiourea was added to this solution in different concentrations and the solution's ability to reduce copper oxide panels was determined. Thiourea was added to the reducing solution in the concentrations listed in Table 12 below.

TABLE 12

| Dimethylamine Borane Concentration | Thiourea Concentration | % Weight Loss | Initiation Time | Acid Resistance |
| --- | --- | --- | --- | --- |
| 5.0 g/L | 0 ppm | 21.7 | 15 sec | >55 min |
| 5.0 g/L | 10 ppm | 20.8 | 25 sec | >55 min |
| 5.0 g/L | 25 ppm | 19.3 | 50 sec | >55 min |
| 5.0 g/L | 35 ppm | 17.4 | 50 sec | 50 min |
| 5.0 g/L | 45 ppm | 16.4 | 90 sec | 35 min |
| 5.0 g/L | 55 ppm | 16.8 | 150 sec | 35 min |
| 5.0 g/L | 65 ppm | 13.3 | 200 sec | <1 min |

An aqueous solution of 10.0 grams per liter dimethylamine borane and 15.2 g/L sodium hydroxide was made. Thiourea was added to this solution in different concentrations and the solution's ability to reduce copper oxide panels was determined. Thiourea was added to the reducing solution in the concentrations listed in Table 13 below.

TABLE 13

| Dimethylamine Borane Concentration | Thiourea Concentration | % Weight Loss | Initiation Time | Acid Resistance |
| --- | --- | --- | --- | --- |
| 10.0 g/L | 0 ppm | 25.6 | 10 sec | >55 min |
| 10.0 g/L | 10 ppm | 21.7 | 30 sec | >55 min |
| 10.0 g/L | 25 ppm | 21.3 | 40 sec | >55 min |
| 10.0 g/L | 55 ppm | 16.8 | 40 sec | >55 min |
| 10.0 g/L | 75 ppm | 18.7 | 60 sec | 50 min |
| 10.0 g/L | 100 ppm | 18.0 | 130 sec | 40 min |
| 10.0 g/L | 120 ppm | 17.3 | 130 sec | 40 min |
| 10.0 g/L | 140 ppm | 18.0 | 140 sec | 40 min |
| 10.0 g/L | 160 ppm | 17.4 | 180 sec | 40 min |
| 10.0 g/L | 180 ppm | 13.9 | 210 sec | >1 min |

EXAMPLE 6

As seen in Example 5, the effective concentration range of stabilizer in the reducing solution is dependent on the concentration of reducing agent. The effective concentration range of stabilizer in the reducing solution is also dependent on the temperature of the reducing solution.

To illustrate the effects of temperature on a dimethylamine borane reducing solution with thiourea as a stabilizer, reducing solutions of similar dimethylamine borane concentrations and thiourea concentrations were made and the ability to reduce copper oxide panels at various temperatures were tested.

An aqueous solution of 1.6 grams per liter dimethylamine borane, 15.2 g/L sodium hydroxide, and 20 ppm thiourea was made. The solution's ability to reduce copper oxide panels was determined for several temperatures. The results are listed in Table 14 below.

TABLE 14

| Dimethylamine Borane Concentration | Thiourea Concentration | Temperature | % Weight Loss | Initiation Time | Acid Resistance |
| --- | --- | --- | --- | --- | --- |
| 1.6 g/L | 20 ppm | 80° F. | 16.5 | 150 sec | <1 min |
| 1.6 g/L | 20 ppm | 100° F. | 16.9 | 110 sec | 35 min |
| 1.6 g/L | 20 ppm | 120° F. | 20.0 | 90 sec | 40 min |

An aqueous solution of 5.0 grams per liter dimethylamine borane, 15.2 g/L sodium hydroxide and 65 ppm thiourea was made. The solution's ability to reduce copper oxide panels was determined at several temperatures. The results are listed in Table 15 below.

TABLE 15

| Dimethylamine Borane Concentration | Thiourea Concentration | Temperature | % Weight Loss | Initiation Time | Acid Resistance |
| --- | --- | --- | --- | --- | --- |
| 5.0 g/L | 65 ppm | 80° F. | 13.3 | 200 sec | <1 min |
| 5.0 g/L | 65 ppm | 100° F. | 15.1 | 165 sec | 35 min |
| 5.0 g/L | 65 ppm | 120° F. | 16.3 | 145 sec | 40 min |

An aqueous solution of 10.0 grams per liter dimethylamine borane, 15.2 g/L sodium hydroxide and 200 ppm thiourea was made. The solution's ability to reduce copper oxide panels was determined at several temperatures. The results are listed in Table 16 below.

TABLE 16

| Dimethylamine Borane Concentration | Thiourea Concentration | Temperature | % Weight Loss | Initiation Time | Acid Resistance |
| --- | --- | --- | --- | --- | --- |
| 10.0 g/L | 200 ppm | 80° F. | 12.5 | >4 min | <1 min |
| 10.0 g/L | 200 ppm | 100° F. | 15.7 | 150 sec | 40 min |
| 10.0 g/L | 200 ppm | 120° F. | 19.8 | 90 sec | 40 min |

EXAMPLE 7

(Prophetic)

The procedures followed in Examples 1–5 will be used, except that ammonia borane will be substituted for DMAB. It is expected that consumption of ammonia borane in stabilized reduction processes will be decreased in a similar manner to the decreased DMAB consumptions observed from the stabilizers listed in Table 10.

EXAMPLE 8

(Prophetic)

Based on observations made by the present inventor as to the effect that increases in reducing agent concentration and temperature have on the effective concentration range of thiourea stabilizer, the present inventor expects that the effective concentration range of the other stabilizers (tolytriazole, benzotriazole, 3-amino-5-methylisoxazole, mercaptobenzothiazole, benzimidazole, and sulfamic acid) can be similarly increased by increasing the reducing agent concentration and/or temperature, from that described in Examples 3 and 4 for those stabilizers. The effects that increases in reducing agent concentration and temperature will have on the effective concentration ranges of all the stabilizers identified in the present invention can be easily tested by using the methods outlined in Examples 5 and 6.

The expected concentration ranges for the stabilizers identified in the present invention is as follows:

Thiourea: about 1 ppm to 1 g/L

Tolytriazole: up to and including about 5 ppm;

Benzotriazole: up to and including about 100 ppm;

3-amino-5-methylisoxazole: up to and including about 1000 ppm;

Mercaptobenzothiazole: up to and including about 1000 ppm;

Benzimidazole: up to and including about 1000 ppm; and

Sulfamic acid: up to and including about 10 g/L.

It is to be understood that the present invention is not confined to the particular construction and arrangement herein illustrated and described, but embraces such modified forms thereof as comes within the scope of the following claims.

What is claimed is:

1. A method of reducing a layer of solid copper oxide on a solid metallic copper layer to be bonded to a resin comprising the steps of exposing the copper oxide layer to an aqueous reducing solution, the aqueous reducing solution comprising an amine borane represented by the general formula $BH_3NHRR'$, wherein the R and R' are each a member selected from the group consisting of H, $CH_3$, and $CH_2CH_3$, and a reducing stabilizer selected from the group consisting of thio-containing ($—C(=S)NH_2$) compounds, triazole-containing ($C_2H_3N_3$) compounds, isoxazole-containing ($—C_3HNO$) compounds, thiazole-containing ($—NCS—$) compounds, imidazole-containing compounds, and sulfone-containing ($—SO_3H$) compounds, the reducing stabilizer being present in an amount sufficient to decrease consumption of the amine borane during reduction to a level less than that consumed in the absence of the reducing stabilizer during the course of the copper oxide reducing process.

2. The improvement of claim 1, wherein the thio-containing compound is thiourea.

3. The improvement of claim 1, wherein thiourea is present at a concentration in the range of about 1 ppm to 1 g/L.

4. The improvement of claim 2, wherein thiourea is present at a concentration in the range of about 1 ppm to 200 ppm.

5. The improvement of claim 1, wherein the triazole-containing compound is tolytriazole.

6. The improvement of claim 5, wherein tolytriazole is present at a concentration in the range up to and including about 5 ppm.

7. The improvement of claim 6, wherein tolytriazole is present at a concentration of about 0.50 ppm.

8. The improvement of claim 1, wherein the triazole-containing compound is benzotriazole.

9. The improvement of claim 8, wherein benzotriazole is present at a concentration in the range up to and including about 100 ppm.

10. The improvement of claim 9, wherein benzotriazole is present at a concentration of about 1.0 ppm.

11. The improvement of claim 1, wherein the isoxazole-containing compound is 3-amino-5-methylisoxazole.

12. The improvement of claim 11, wherein 3-amino-5-methylisoxazole is present at a concentration in the range up to and including about 1000 ppm.

13. The improvement of claim 12, wherein 3-amino-5-methylisoxazole is present at a concentration of about 100 ppm.

14. The improvement of claim 1, wherein the thiazole-containing compound is selected from the group consisting of mercaptobenzothiazole and benzimidazole.

15. The improvement of claim 14, wherein the thiazole-containing compound is present at a concentration in the range up to and including 1000 ppm.

16. The improvement of claim 15, wherein the thiazole-containing compound is present at a concentration of about 10 ppm.

17. The improvement of claim 1, wherein the sulfone-containing compound is sulfamic acid.

18. The improvement of claim 17, wherein sulfamic acid is present at a concentration in the range up to and including 10 g/L.

19. The improvement of claim 18, wherein sulfamic acid is present at a concentration of about 10 g/L.

* * * * *